United States Patent [19]
Herman et al.

[11] Patent Number: 5,841,384
[45] Date of Patent: Nov. 24, 1998

[54] NON-LINEAR DIGITAL-TO-ANALOG CONVERTER AND RELATED HIGH PRECISION CURRENT SOURCES

[75] Inventors: Ray Michael Herman, Huntington Beach; Anthony Lenardo McKay, Long Beach; Neng-Tze Yang, Palos Verdes Estates, all of Calif.

[73] Assignee: Hughes Electronics, Los Angeles, Calif.

[21] Appl. No.: 292,652

[22] Filed: Aug. 18, 1994

[51] Int. Cl.$^6$ ...................................................... H03M 1/62
[52] U.S. Cl. ........................... 341/138; 341/144; 341/154
[58] Field of Search ................................... 341/138, 140, 341/144, 147, 153, 154

[56] References Cited

U.S. PATENT DOCUMENTS

| | | | |
|---|---|---|---|
| 4,338,592 | 7/1982 | Wilensky | 340/347 CC |
| 4,396,907 | 8/1983 | Wintzer et al. | 340/377 C |
| 5,243,347 | 9/1993 | Jackson et al. | 341/144 |
| 5,283,580 | 2/1994 | Brooks et al. | 341/145 |

*Primary Examiner*—Todd E. DeBoer
*Attorney, Agent, or Firm*—Gordon R. Lindeen, III; Leonard A. Alkov; Wanda K. Denson-Low

[57] ABSTRACT

A digital-to-analog converter (DAC) for generating a high-precision analog output signal corresponding to a non-linear function, such as a sine function, of a digital input quantity, without the need for large numbers of precision current generators. Binary weighted current sources provide currents that, when selectively combined to provide a single output current, are approximately equivalent to the non-linear function of the digital input quantity, and an interpolation network provides an interpolation current that is added to the output current. The interpolation network may be selected to provide linear or non-linear interpolation between output current values. In other disclosed embodiments, multiple interpolation networks are used, either to provide different interpolation techniques for different ranges of input values, or to be connected effectively in series to provide for still greater accuracy without using additional current sources. In accordance with a related technique, the weighted current sources are derived from a relatively small number of identical current sources. Some of the identical current sources are connected to binary division networks to provide successively smaller binary fractions of the identical currents, and a summing network selectively combines the identical currents and the binary fractions of the identical currents, to provide multiple outputs weighted as needed for the non-linear DAC.

29 Claims, 5 Drawing Sheets

NON-LINEAR DIGITAL-TO-ANALOG CONVERTER AND RELATED HIGH PRECISION CURRENT SOURCES

BACKGROUND OF THE INVENTION

This invention relates generally to digital-to analog converters and to precision current sources used in such converters. More particularly, the invention relates to digital-to-analog converters that output a non-linear analog function of a digital input signal. For example, a non-linear digital-to-analog converter may be designed to output a sine function, i.e., the sine of the angle of which a digital representation is provided as an input signal. Sine wave generators of this type have many useful applications, such as in communications devices.

A digital-to-analog converter (DAC) converts a digital input, consisting of a number of bits making up an input data word, into an analog output signal that is some function of the input digital word. The most common form of DAC is a linear DAC, which generates an analog signal that is linearly proportional to the value of the input digital data word. However, in some applications non-linear DACs are needed, to generate an analog output signal that is a non-linear function of the value of the digital input.

Non-linear DACs are useful in systems called direct digital synthesizers (DDSs), which generate a sampled sinusoidal waveform from a series of input digital data words. A continuous function, such as a sine wave, is represented by a series of discrete sample values taken at sample intervals and provided as digital input words to the DAC. The analog output signal has a fixed amplitude during each short sampling period, and steps to a new amplitude for each successive sampling period. Thus the output is a close approximation to an analog sine wave. A DDS of this type might be used, for example, to produce a pure sine waveform with a controlled frequency and phase. The phase can be conveniently represented in digital form by the value in an accumulator register. The accumulator is controlled in part by a clock signal. At each clock pulse, a fixed phase increment is added to the accumulator, which represents a current phase value for the sine wave. At a selected threshold, such as 360°, the accumulator overflows or resets to zero. The frequency of the output waveform is determined by the value of the digital phase increment and by the clock period, which can be controlled by a high-precision clocking signal. Therefore, control of the phase increment and the accumulator clocking period allows the frequency and phase of the analog output signal to be precisely and rapidly varied. Such a waveform can be used in radio communications applications. DACs are especially useful in the implementation of DDS systems since they can be used to convert the digital representations of the output waveform, as generated internally in the DDS from the digital phase value in the accumulator, to the analog sampled waveform output.

In general, a DAC can be implemented as a set of switches controlling the summation of a set of weighted analog current sources, such that the current at the DAC output can be the sum of currents from any combination of the current sources. To implement a DAC that outputs an analog value that is linearly proportional to the value of the input digital data word (i.e., a linear DAC), a set of binary weighted current sources can be used, such that each current source provides a current that is double the current of the next smaller current source. By this means, each bit of the input data word controls whether or not a corresponding current source is summed at the output of the DAC. For each bit that is "high" or "one," the associated current source is summed at the DAC output, while for each bit that is "low" or "zero" the associated current source is not coupled to the output. The sum of the coupled current sources produces a current amplitude at the DAC output that is proportional to the binary value of the input data word. Thus an N-bit DAC would sum N weighted current sources in $2^N$ possible values of the N-bit input word. High precision linear DACs can be implemented using a low number of current sources because, in principle, only one current source is needed for each bit position.

Such a linear DAC can also be used in a DDS system. However, the DDS system must include means for converting the digital data word representing phase (as generated in the accumulator) into a digital word representing the corresponding amplitude as determined by the sine function. One way to do this is with a dedicated read-only memory (ROM) containing all the required sine function digital values. The ROM is addressed by a phase or angle value and provides the corresponding sine function value, which may then be converted to analog form in the linear DAC. The use of a ROM, of course, adds cost and complexity to the DDS system and is not the preferred approach. A more useful implementation is a SINE-DAC, that is, a non-linear DAC that outputs the analog value of the sine function directly, without the need for a ROM or other component to store the sine function values.

Prior art approaches to implement a SINE-DAC are much more complex than a linear DAC, because the slope of the sine function is not constant. Equal increments in input phase do not result in equal increments in output amplitude, but instead vary as the value of the phase is varied. For a linear DAC, incrementing one bit of the input will result in incrementing the output by a fixed amount that is independent of the value of the other bits. This is why each input bit of a linear DAC can independently control a fixed current source, and why an N-bit DAC requires only N current sources and associated control switches. In non-linear DAC, such as a SINE-DAC, incrementing one bit of the input will results in incrementing the output by an amount dependent on the values of the other bits. Prior art implementations of a SINE-DAC require a current source for each increment in phase. For example, a SINE-DAC with N-bit resolution through the phase angle range from −90° to +90° would require $2^N$ current sources. Therefore, for each bit of resolution added, the number of current sources and associated switches must double. Prior art SINE-DACs with many bits of phase resolution became impractical due to the large number of current sources and associated control switches.

In summary, the use of a linear DAC in a high precision DDS system requires complex means to convert digital phase values to corresponding digital amplitudes before conversion to analog form. Although the use of a SINE-DAC overcomes this problem, obtaining high resolution with a SINE-DAC has proved elusive because of the large number of current sources needed for high precision. ($2^N$ current sources for N-bit resolution.) It will be apparent, therefore, that there is a need for a SINE-DAC that provides high resolution without the need for such a large number of separate current sources. The present invention satisfies this need.

Another difficulty in the design of non-linear DACs arises from the need to provide a relatively large number of current sources having high precision amplitudes that are, in general, arbitrary in value. Until now, there has been no practical method to implement high-precision arbitrary current sources. One known method to achieve high precision in a current source is to trim current-dependent resistors by laser irradiation. Of course, laser trimming is both time consuming and costly. Another known method is to sum numerous identical small current sources. A published example of this technique uses 128 small current sources to generate current for a DAC having seven to eight bits of accuracy. A DAC with 11–12 bits of accuracy would need 2,048–4,096 small current sources and it would be impractical to form these on a single semiconductor device. Accordingly, another need in the field of DACs, and especially non-linear DACs, is for a technique for providing multiple arbitrary current sources without using large numbers of small current sources and without having to trim standard current sources by laser or other means. The present invention, in accordance with one of its aspects, also satisfies this need.

SUMMARY OF THE INVENTION

The present invention resides in a non-linear digital-to-analog converter (DAC) that provides high resolution with reduced complexity. In accordance with another aspect of the invention, multiple arbitrary current sources needed for a non-linear DAC are provided without large numbers of small current sources and without the need for laser trimming to obtain the desired current values.

Briefly, and in general terms, the non-linear DAC of the present invention comprises a plurality of non-linearly weighted current sources; a digital input circuit for inputting a digital input quantity; an analog output circuit; an interpolation network; and current source selection logic, responsive to a selected number of bits of significance of the digital input quantity. The function of the current source selection logic is to select one of the current sources for connection to the interpolation network and a subset of the remaining current sources for connection to the analog output circuit. The current sources connected to the analog output circuit provide a combined current approximately proportional to a non-linear function of the digital input quantity. The interpolation network includes an input circuit into which the current source selected for connection to the interpolation network injects an input current, interpolation control logic, responsive to a selected number of bits of lesser significance of the digital input quantity, and a plurality of output taps from which various fractions of the input current are selected for combination with current from the remaining current sources. In this way, a high degree of accuracy is obtained without the need for a large number of current sources.

In the embodiments illustrated, the current source selection logic includes an equal plurality of switches, each of which has an input terminal connected to a corresponding one of the current sources, an interpolate output terminal connected to the interpolation network, and at least one other output terminal connected to the analog output circuit; and switch control logic for generating control signals that select one of the switches to switch to an interpolate position, in which its input terminal is connected to its interpolate output terminal. The switch control logic also selects a subset of the remaining switches to switch to an on position, in which their input terminals are connected to the output terminals that are connected to the analog output circuit.

In the preferred embodiment of the invention the analog output circuit is a differential circuit having first and second terminals. The plurality of switches include a first switch having an "on" output terminal connected to the first terminal of the output circuit, a last switch having an "off" output terminal connected to the second terminal of the output circuit, and remaining switches having both "on" terminals and "off" terminals.

In one embodiment of the invention, the interpolation network effects a linear interpolation of the current values provided by the plurality of non-linear weighted current sources. In another embodiment, the interpolation network effects a non-linear interpolation. For some non-linear functions, linear interpolation may provide a satisfactory approximation of the desired output function over a narrow interpolation range. For other non-linear functions, it may be desirable to provide for non-linear interpolation.

Yet another embodiment of the invention includes at least one additional interpolation network. The interpolation networks are each connected to a different subset of the three-position switches, and each interpolation network is effective over a different range of digital input quantities. Each interpolation network may effect either a linear or a non-linear interpolation. This configuration may be useful in the case of non-linear functions that are relatively linear over some ranges of values. For example, for interpolating a sine function in a range of angle values near 0° or 180° linear interpolation may be satisfactory, but in another range of values close to 90° the sine function changes more rapidly and a non-linear interpolation may be appropriate.

In still another embodiment of the invention, the DAC further comprises at least one additional interpolation network connected effectively in series with the first defined interpolation network. The additional interpolation network is controlled by a selected set of additional bits of lesser significance of the digital input quantity, to provide an additional level of interpolation and a correspondingly greater accuracy without any additional current sources.

In accordance with another aspect of the invention, the plurality of non-linearly weighted current sources in the DAC are derived from a limited number of identical current generators. More specifically, the plurality of non-linearly weighted current sources are derived from circuitry including a plurality of identical precision current sources; at least one binary division network, having as an input one of the identical current sources and providing as outputs a plurality of binary weighted currents that are binary fractions of the input current; and at least one summing network, having as inputs the binary weighted currents from the at least one binary division network and the currents from a selected number of the plurality of identical current sources, and providing as outputs the required plurality of non-linearly weighted current sources. The summing network selectively combines its input currents to provide the required output currents to a high level of accuracy without the need for large numbers of precision current sources. Currents from a selected number of the identical current sources are applied directly to the summing network and current from each of the remaining identical current sources is applied as an input to its own binary division network, which produces output currents proportional to successively smaller binary fractions of the input current. In the illustrative embodiment, the non-linear DAC produces a sine function output proportional to the digital input quantity, and one summing network supplies sixteen output currents used to generate differential sine function values from which are derived sine function values over an input angle range of ninety degrees. In this embodiment, there are sixteen identical current generators, of which nine are connected directly to the summing network and the remaining seven are connected to seven binary division networks; and each binary division network produces currents of seven successively smaller binary fractions of the input current. The summing network combines the input currents from the identical current sources and from the binary division networks in such a manner as to produce the desired differential sine currents.

One aspect of the present invention may be defined in terms of apparatus for providing a plurality of current sources of different selected values. The apparatus comprises a plurality of identical current sources; at least one binary division network, having as an input one of the identical current sources and providing as outputs a plurality of binary weighted currents that are binary fractions of the input current; and at least one summing network, having as inputs the binary weighted currents from the at least one binary division network and the currents from a selected number of the plurality of identical current sources, and providing as outputs the required plurality of current sources. The summing network selectively combines its input currents to provide the required output currents to a high level of accuracy without the need for large numbers of precision current sources. In this apparatus, currents from a selected number of the identical current sources are applied directly to the summing network; and current from each of the remaining identical current sources is applied as an input to its own binary division network, which produces output currents proportional to successively smaller binary fractions of the input current.

In this form of apparatus as used in a SINE-DAC device, the current sources of different selected values are differential sine values for use in the SINE-DAC and one summing network supplies sixteen output currents. There are sixteen identical current generators in the illustrative embodiment, of which nine are connected directly to the summing network and the remaining seven are connected to seven binary division networks. Each binary division network produces currents of seven successively smaller binary fractions of the input current and the summing network combines the input currents from the identical current sources and from the binary division networks in such a manner as to produce the desired differential sine currents.

More specifically, in the illustrative embodiment each of the identical current sources generates a current proportional to one-sixteenth, or $2^{-4}$, of total current generated by all sixteen of the identical current sources; and each binary division network generates output currents proportional to seven successively smaller binary fractions of the input current, from $2^{-5}$ through $2^{-11}$, together with a remainder current of $2^{-11}$. The summing network combines the input currents in such a way as to produce sixteen differential sine output currents, which, when combined by addition of successive ones of the output currents, provide currents that are proportional to a sine function.

The invention may also be expressed as a method for generating a set of currents of selected values. The method comprises the steps of generating a plurality of currents of identical value; applying some of the plurality of currents to binary division networks; generating in each binary division network a set of output currents that are successively smaller binary fractions of the input identical current; and combining in a summing network a selected number of the currents of identical value with the output currents from the binary division networks. Precision outputs of selected values are provided without the need for large numbers of precision current sources. In the preferred embodiment of this method, the summing network is configured to use all of the binary division network outputs and all of the remaining identical currents, to provide the desired output currents with a minimum number of current sources.

The invention may also be expressed as a method of operation of a non-linear digital-to-analog converter (DAC), comprising the steps of (a) generating a plurality of weighted currents; (b) receiving a digital input quantity; (c) based on a selected number of bits of the digital input quantity, selecting a set of the weighted currents to be combined to provide an output current that is approximately proportional to a desired non-linear function of the digital input quantity; (d) based on the value of the digital input quantity, selecting one of the weighted currents to be interpolated for greater accuracy of output; (e) connecting the weighted current to be interpolated to an interpolation network; (f) controlling the interpolation network based on a selected number of bits of the digital input quantity, to provide an interpolation current; and (g) combining the set of weighted currents selected in step (c) and the interpolation current provided in step (f), to generate an output current proportional to the desired non-linear function of the digital input quantity.

In this method the interpolation current provided by the interpolation network may be result of linear interpolation or non-linear interpolation between current values. In one embodiment of the method, the step (e) of connecting to an interpolation network includes connecting to one of at least two interpolation networks covering non-overlapping groups of the weighted currents. Each of the multiple interpolation networks may be linear or non-linear in character. This method may also comprise the steps of applying the interpolation current provided in step (f) to an additional interpolation network; controlling the additional interpolation network based on the value of an additional set of bits of lesser significance in the digital input quantity, to provide an additional interpolation current; and combining the additional interpolation current with the output current to provide additional accuracy without any additional current sources. The step of generating a plurality of weighted currents may include generating a plurality of currents of identical value; applying some of the plurality of currents to binary division networks; generating in each binary division network a set of output currents that are successively smaller binary fractions of the input identical current; and combining in a summing network a selected number of the currents of identical value with the output currents from the binary division networks, wherein precision outputs of selected values are provided without the need for large numbers of precision current sources. Preferably, the summing network is configured to use all of the binary division network outputs and all of the remaining identical currents, to provide the desired output currents with a minimum number of current sources.

It will be appreciated from the foregoing that the present invention represents a significant advance in the field of non-linear DACs. In particular, the invention provides a non-linear DAC of high accuracy without the need for a large number of precision current sources. In addition, the present invention provides a source of multiple currents of selected values, by combining a number of identical currents and binary fractions of the identical currents. Other aspects and advantages of the invention will become apparent from the following more detailed description, taken in conjunction with the accompanying drawings.

DESCRIPTION OF THE PREFERRED EMBODIMENTS

As shown in the drawings for purposes of illustration, the present invention pertains to a non-linear digital-to-analog converter (DAC) and related arbitrary current sources. In the past, it has required costly and complex apparatus to implement a non-linear DAC, such as a DAC for providing sine function analog output values in response to digital phase angle input values. For a non-linear DAC with N-bit resolution, as many as $2^N$ current sources are needed, too many for a practical implementation of some applications of non-linear DACs.

In accordance with one aspect of the invention, and as will be explained with reference to FIGS. 1–4, a selected number of least significant bits of an input data word are used to control an interpolation network, while the remaining bits of higher significance are used to control a set of current sources, only one of which is selected for connection to the interpolation network. In accordance with another aspect of the invention, the current sources controlled by the input bits of higher significance are provided by a relatively small number of identical current sources, as will be explained further below, with reference to FIG. 5.

Figure 1:
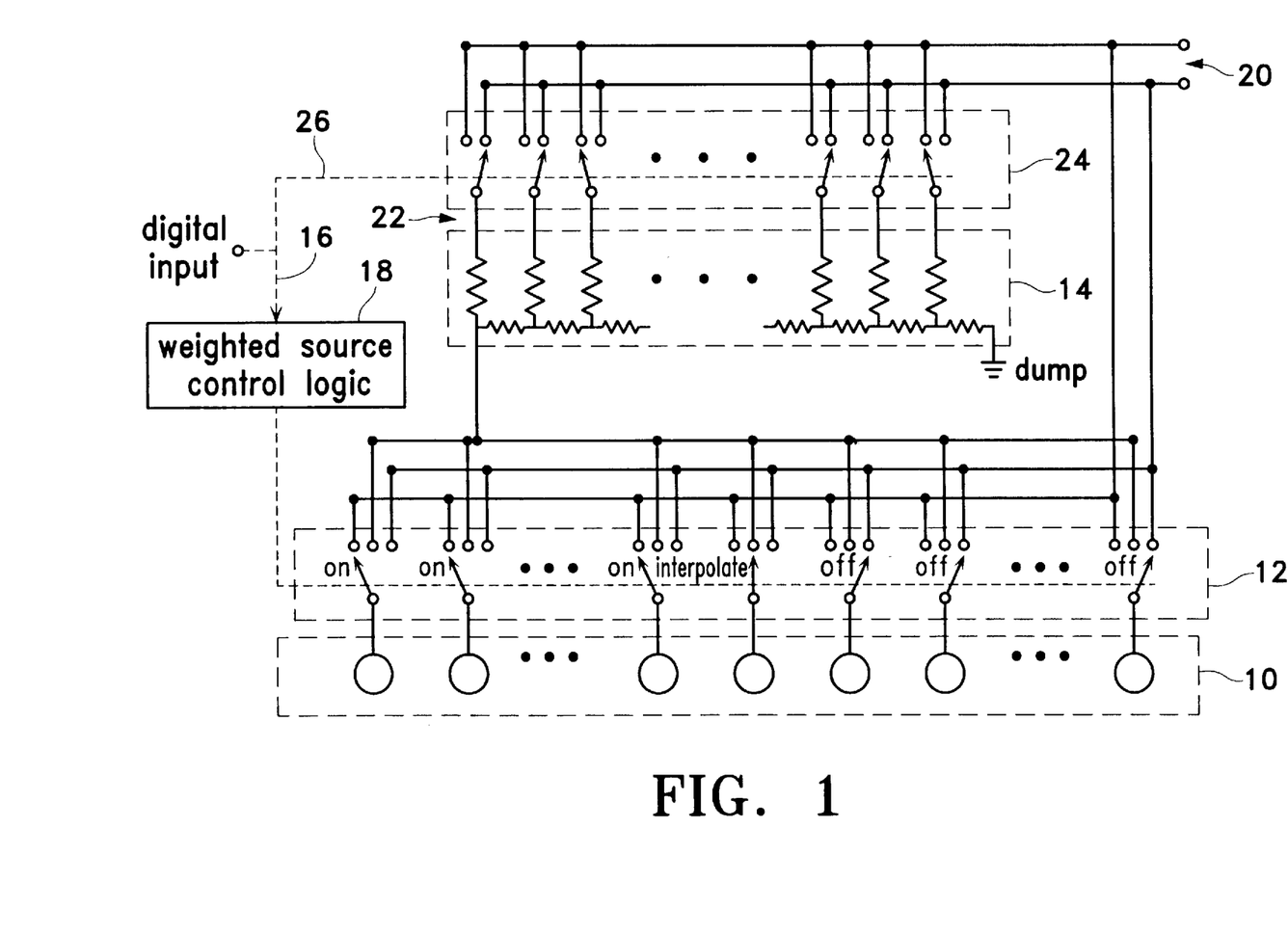
FIG. 1 is a functional schematic diagram of a non-linear digital-to-analog converter (DAC) in accordance with the present invention, including a linear interpolation splitting network for improved resolution.

The non-linear DAC of the invention is shown in one embodiment in FIG. 1. The non-linear DAC is installed in a device (not shown) for the purpose of converting a stream of digital input values into a varying analog output signal. The device in which the DAC is installed can, for example, comprise a direct digital synthesizer (DDS) in which digital values representing phase angles are provided as input to the DAC, which then recreates a sine function as an analog current. The DAC of the invention includes a set of $2^N$ precision weighted current sources, indicated by reference numeral 10, where N is a selected number of most significant bits of the digital input values. For example, if N=5, the number of current sources 10 is $2^5$=32. Each of the current sources 10 is controlled by one of a set of three-position switches 12. The current sources 10 are scaled such that, when each is added in turn to all the preceding smaller sources in the set, the total current represents the desired non-linear output function amplitude corresponding to the number of sources being summed. For example, if the non-linear DAC is a SINE-DAC providing sine values for phase angles of 0° to 180°, then the sine function provided by the current sources will correspond to angle increments of $(180/2^N)°$. If N=5, the angle increments are each $(180/32)°$=5.625°. When only the first of the switches 12 is on, the current supplied is proportional to sin 5.625°. When the second of the switches 12 is also closed, the total current from the first two current sources is proportional to sin $(2 \times 5.625)°$. When the third of the switches 12 is also closed, the total current from the first three current sources is proportional to sin $(3 \times 5.625)°$, and so forth. In the presently preferred embodiment of the invention, the SINE-DAC actually generates a cosine output proportional to $(\cos \theta - 1)$, where $\theta$ is the input angle. This function is convenient in that it varies from zero (for $\theta=0°$) to a negative maximum (for $\theta=180°$).

Each of the current switches 12 has three positions: on, off, and interpolate. As shown in FIG. 1, only one of the switches 12 is in the interpolate position, while all the switches to the left of that switch are in the on position and all switches to the right of that switch are in the off position. The arrangement of the switches and current sources in the drawing is such that the current sources must be added together from left to right to obtain the desired sine (or cosine) function for output. Current from the current source 10 corresponding to the switch 12 in the interpolate position is connected to a linear interpolation splitting network 14, which generates an interpolation current to add to the currents passing through the switches 12 in the on position. Each digital input word is split into two portions. In the illustrative embodiment, five of the most significant bits are transmitted over line 16 to weighted source control logic 18, which controls the positions of the switches 12 in accordance with the value of the digital input. More specifically, the most significant bit of the digital input word is used as a sign or polarity bit. This bit changes state for values of input angle above 180°, so that the same set of current sources can be used to generate sine function values over a full 360° range. The next N bits (five in the illustrative embodiment) are transmitted to the control logic 18 and determine the states of the switches 12.

The control logic 18 generates a three-state output signal to each of the switches 12 in accordance with a simple test. The N-bit value that is input to the control logic 18 is considered as numerical value between 1 and $2^N$ (between 1 and 32 in the more specific example). This numerical input value is referred to as $N_{INPUT}$ for purposes of explanation of how the logic operates. Each output signal $O_n$ (for n=1 through N) is set according to the following rules:

$O_n$="on" if $n < N_{INPUT}$,
$O_n$="off" if $n > N_{INPUT}$, and
$O_n$="interpolate" if $n = N_{INPUT}$.

Thus, only one of the switches 12 is set to the interpolate position, while those corresponding to smaller digital input values are set to the on position and those corresponding to greater digital input values are set to the off position. Current contributions from the switches 12 in the on position are summed at output terminals 20, as will be explained further below. The function of the linear interpolation splitting network 14 is to further divide the current from the source selected for interpolation, into smaller subcomponents, under control of digital input bits of lower significance. Basically, the network splits the current into M binary weighted parts 22, which are coupled to a set of M interpolation control switches 24. The M least significant bits of each digital input word are transmitted over line 26 to control the switches 24. These switches direct the output currents of the binary splitting network to either the off or on sides of the differential output terminals 20. The resulting output current replicates the sine function in a piece-wise linear manner with $_2{}^N$ linear sections over 180° of phase and a linear interpolation section to provide M additional bits of resolution without having to provide additional current sources.

The interpolation network 14 can be implemented in a variety of ways. For linear interpolation, a simple resistive network, often referred to as an R/2R network will suffice. In such a network, each of the resistors in a vertical orientation in the drawing has a resistance value 2R and each of the resistors in a horizontal orientation has a value R, except the right-most resistor, which has a value 2R. This network divides the input current into two equal parts at each junction between resistors. Because a pair of resistors 2R in parallel has an effective resistance of R, the current arriving at each junction "sees" an effective resistance of 2R along each path that it may take from the junction. Therefore, current is divided into two equal portions at each junction and a set of binary weighted currents is obtained. The bits of the input word that control the switches 24 may then be applied directly to the switches to obtain an interpolation current to be added to the current contributions from the three-position switches 12 in the on position. In the presently preferred embodiment of the invention, current contributions from the interpolation network 14 are combined with the contributions from the switches 12 using differential output terminals 20. The switches 24 have two positions. In one position, the current contribution from the interpolation network 14 is added to one of the differential output lines 20, and in the other position the current contribution is added to the other of the lines 20. Alternatively, a single-ended output configuration may be used, with the currents derived from one of the switch positions being connected to ground.

Preferably, the three-position switches 12 are also connected to differential output terminals 20. As mentioned earlier, the total current from all of the switches 12 in the "on" position, i.e. the switches to the left of the one switch in the interpolate position, is proportional to $(\cos \theta - 1)$ in the preferred embodiment of the invention. This total current is injected onto the upper rail of the outputs 20. The switches 12 to the right of the switch in the interpolate position, i.e. the switches in the "off" position, have a total current value proportional to $-(1+\cos \theta)$. The differential output terminals 20 are connected to circuitry, such as a transformer (not shown) for combining the two output lines subtractively, and producing an output voltage proportional to the difference between the two components of the output current. More specifically, the output produced as a result of the current contributions from the switches 12 will be proportional to:

$$(\cos \theta - 1) + (1 + \cos \theta) = 2 \cos \theta.$$

Alternatively, the "off" positions of the switches 12 may be connected to ground, and a single-ended output used to provide a signal proportional to the accumulated current contributions from the switches in the "on" position, i.e., proportional to $(\cos \theta - 1)$. The foregoing description of the nature of the output signals assumes that the current sources 10 generate negative currents. If positive currents are used, the currents from the switches in the "on" position sum to a value proportional to $(1 - \cos \theta)$, and the currents from the switches in the "off" position sum to a value proportional to $(1 + \cos \theta)$. Otherwise, the analysis is the same.

Figure 2:
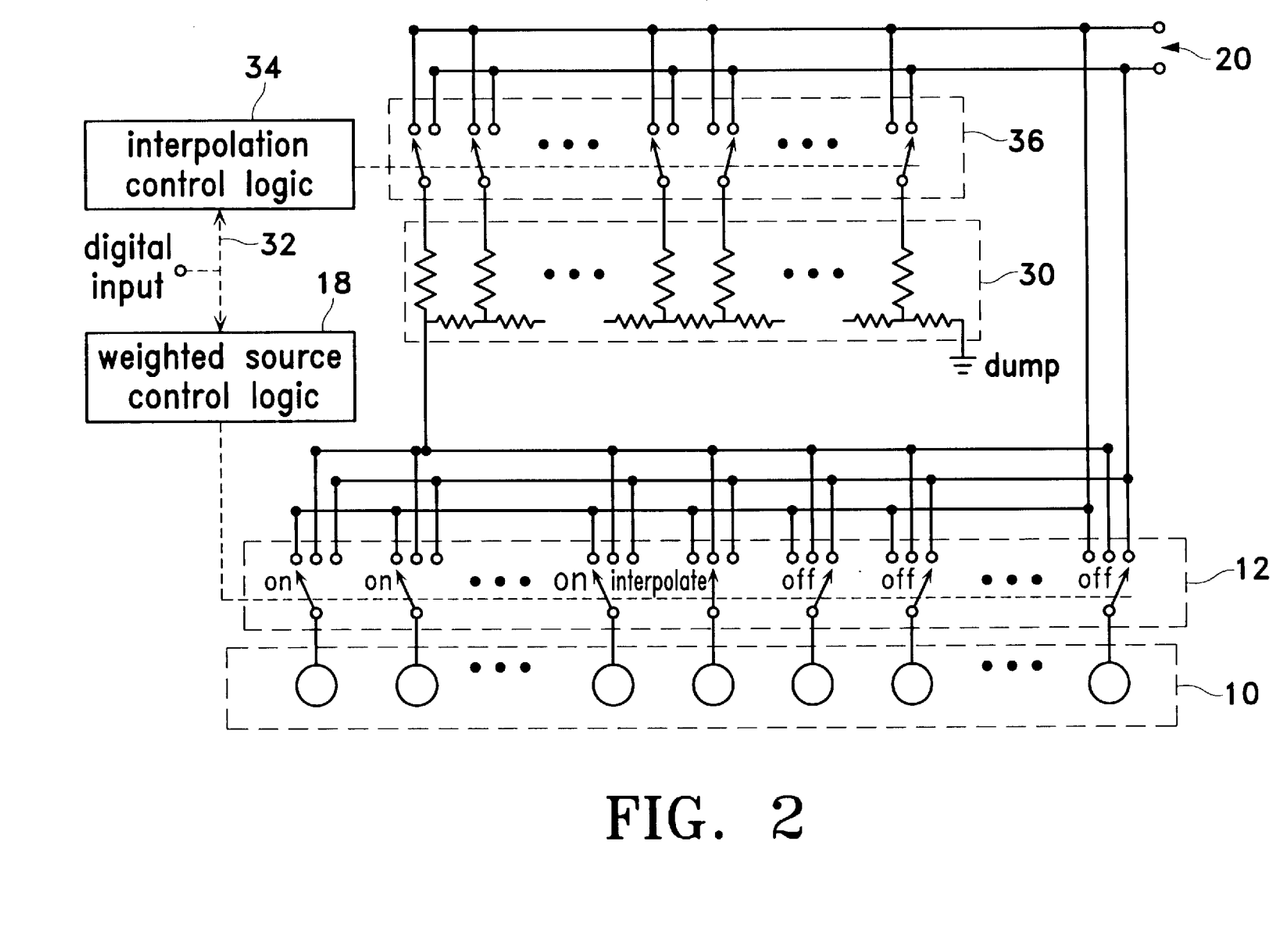
FIG. 2 is a functional schematic diagram of another embodiment of the present invention, including a non-linear interpolation splitting network.
Figure 3:
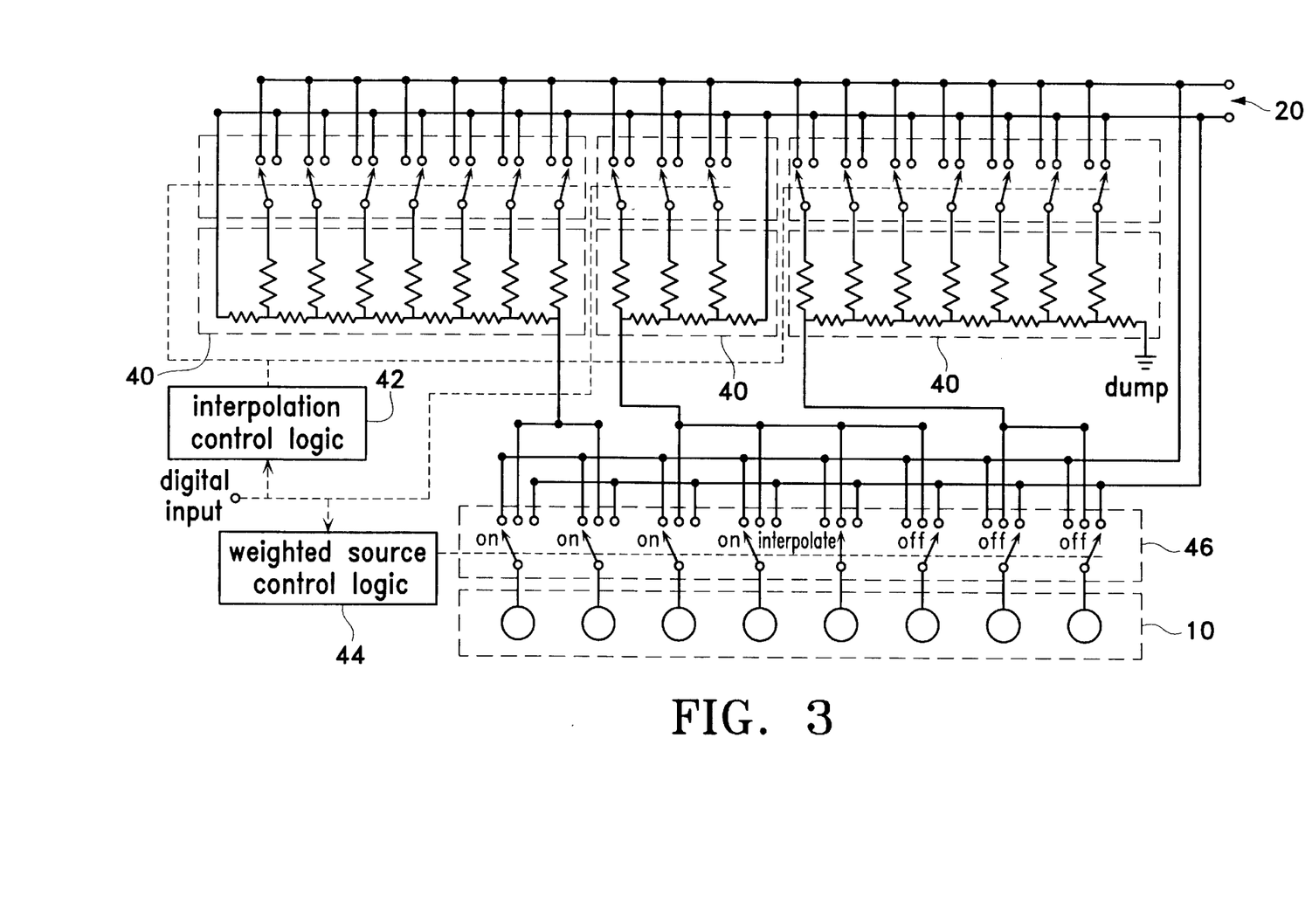
FIG. 3 is a functional schematic diagram of another embodiment of the present invention, including multiple interpolation splitting networks operating over separate non-overlapping ranges of input values.
Figure 4:
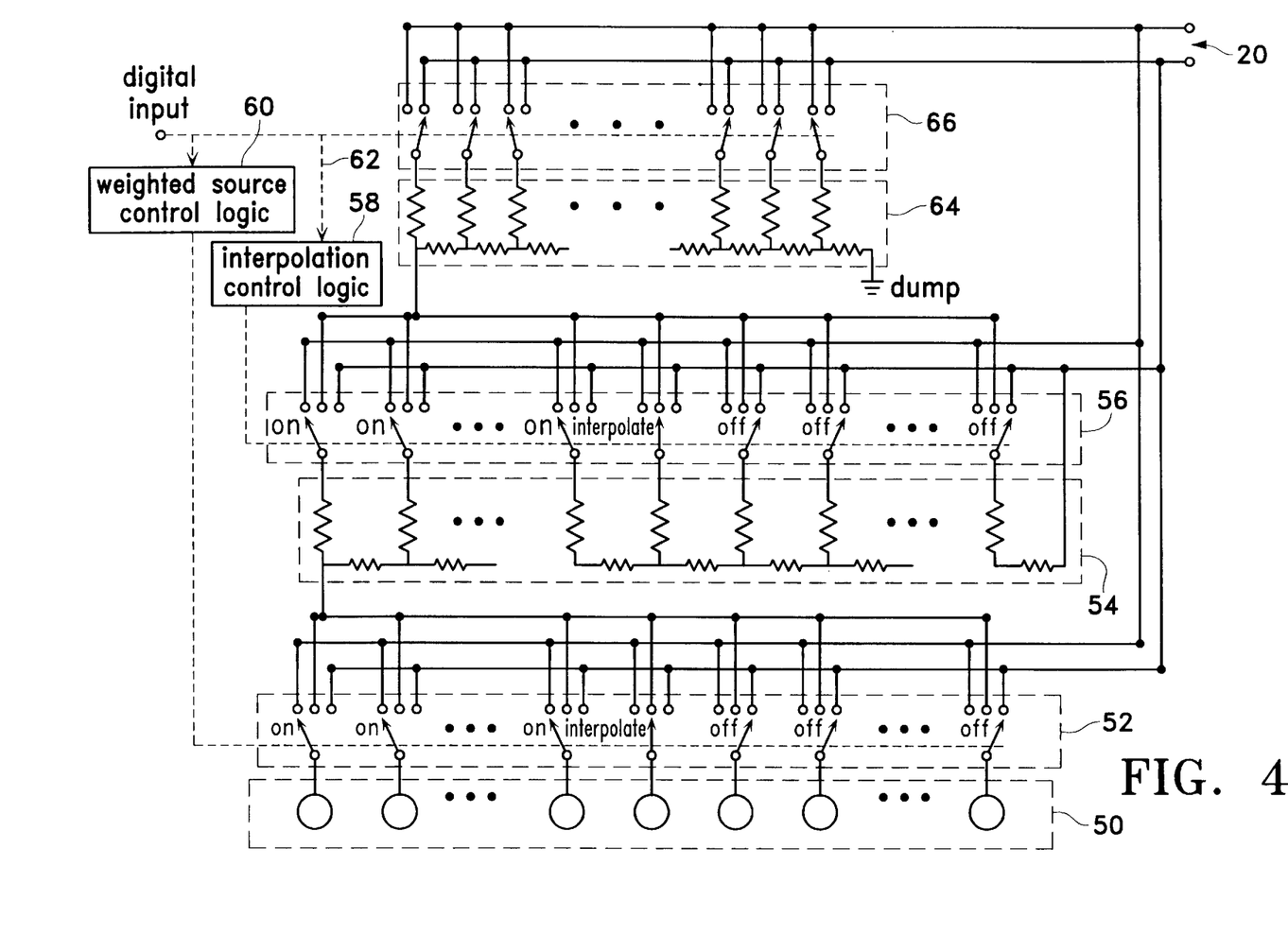
FIG. 4 is a functional schematic diagram of another embodiment of the present invention, including multiple interpolation splitting networks operating in series to obtain higher resolution.

Another feature of the FIG. 1 embodiment, which also applies to the embodiments of FIGS. 2–4 to be described, is that not all of the switches 12 need to be three-position switches. The left-hand switch does not need an "off" position, since there cannot be a switch in the "interpolate" position to the left of this switch. Similarly, the right-hand switch does not need an "on" position. However, depending on the technology employed it may be convenient to design all the switches 12 as three-position switches.

Other variations of the FIG. 1 configuration of a non-linear DAC in accordance with the invention offer additional benefits. One such variation is shown in FIG. 2 and uses a non-linear interpolation splitting network. The operation of the FIG. 2 configuration is similar to that of FIG. 1 except for the operation of the non-linear interpolation splitting network, indicated at 30 and its associated components. For example, if a non-linear DAC is designed to provide as output the analog value of an exponential function of the digital input, then an exponential interpolation splitting network may give a more accurate representation of the desired function than could be obtained from a linear interpolation. The non-linear interpolation network 30, may be implemented as a resistive network that splits the input current into appropriately scaled parts. The current is scaled such that, when each part is added in turn to the total, the total sums represent the values of the desired interpolation function at equal steps in phase. The less significant bits of the input phase word, on line 32, are used by interpolation control logic 34, which controls interpolation control switches 36. The interpolation control switches are controlled in the manner of a thermometer code. That is to say, a continuous sequence of the switches is set to the on condition and then the remaining sequence of switches is set to the off condition. As the digital value of the M-bit portion of the input increases, and increasing number of switches 36 is turned on, changing the current contributed by the interpolation network to the output terminals 20. The specific weights provided by each part of the network depend on the nature of the non-linear function being interpolated.

A third configuration is shown in FIG. 3. This variation of the interpolation logic includes multiple interpolation splitting networks 40, which provide different interpolation functions used over different regions of the non-linear function being represented at the DAC output. The operation of this configuration is similar to the operation of FIGS. 1 and 2 except for presence of the multiple interpolations networks 40, which may be linear or non-linear in any combination. The interpolate position of each of the $2^N$ three-way switches, indicated as 46 in FIG. 3, is connected to one of the interpolation networks 40 that is appropriate for the region of the non-linear DAC function covered by that particular weighted source. Three interpolation networks 40 are shown by way of illustration. One network 40 is supplied with current from a selection of current sources covering a low range of digital input values. Another network is supplied with current from a selection of current sources covering a high range of digital input values. A third network 40 receives current from the remaining current sources covering a mid-range of digital input values. This configuration provides for a more accurate interpolation process, since the manner of interpolation can be varied depending into which range the digital input value falls. For example, it might be known from the nature of the non-linear function that interpolation at the low and high ends of the 180° span of input values can best be performed in a non-linear manner, while the nature of the function in an mid-range of values might dictate using a linear interpolation function for that range.

Note that current is directed to only one of the interpolation splitting networks at any on time. This can reduce the complexity of the interpolation control logic 42, since this logic does not need to discriminate which interpolation splitting network is in use. Discrimination is performed automatically by the weighted source control logic 44, which directs the appropriate current only to the appropriate interpolation spitting network. The advantage of this configuration can best be described by example, assuming a SINE-DAC using three interpolation splitting networks. The weighted current sources that define the region near −90° of phase, where the SINE function has a positive curvature, may be directed to a non-linear interpolation splitting network with positive interpolation curvature. The weighted current sources that define the region near 0° of phase, where the SINE function has little curvature, may be directed to a linear interpolation splitting network. The weighed current sources that define the region near +90° of phase, where the SINE function has a negative curvature, may be directed to a non-linear interpolation splitting network with negative interpolation curvature. This would offer a SINE-DAC achieving a more accurate representation of the desired SINE function than a piece-wise linear representation offered by a SINE-DAC using the same number of current sources and only one interpolation splitting network.

A fourth configuration of the non-linear DAC of the invention is shown in FIG. 4. Operation of this configuration is also similar to that of FIGS. 1 and 2, except that multiple interpolation networks are connected in series to provide even higher resolution. This variation has a non-linear interpolation splitting network 54 to provide the first current split of the current supplied from the appropriate current source, indicated in this figure at 50, as determined by weighted source control switches 52. The source currents from this first interpolation splitting network 54 are coupled to a second set of three-way switches 56, the states of which are determined by switch control logic 58. The operation of the second set of three-way switch 56 and the control logic 58 is similar to the operation of the weighted source control switches 52 and the weighted source control logic 60, except that the second set of switches is controlled by the appropriate less significant bits of the digital input, on line 62. In an operation similar to the operation of the weighted source control switches 52, one part of the current from the first interpolation splitting network 54 is directed to a second interpolation splitting network 64. The operation of the second interpolation splitting network 64, and its associated control switches 66, is similar to the operation of the interpolation splitting network of FIG. 1 and FIG. 2. In some applications, this configuration can have an advantage over other configurations, in achieving a higher resolution with fewer current sources and switches.

The current sources 10 in FIG. 1 and the similar current sources in the other configurations of FIGS. 2–4 have to provide precise selected currents. As mentioned above, prior approaches to generating a set of currents of selected values have required laser trimming of resistive components or the use of very large numbers of small current sources. In accordance with another aspect of the present invention multiple currents of selected values are generated from a relatively small number of identical current sources, as illustrated in FIG. 5.

Figure 5:
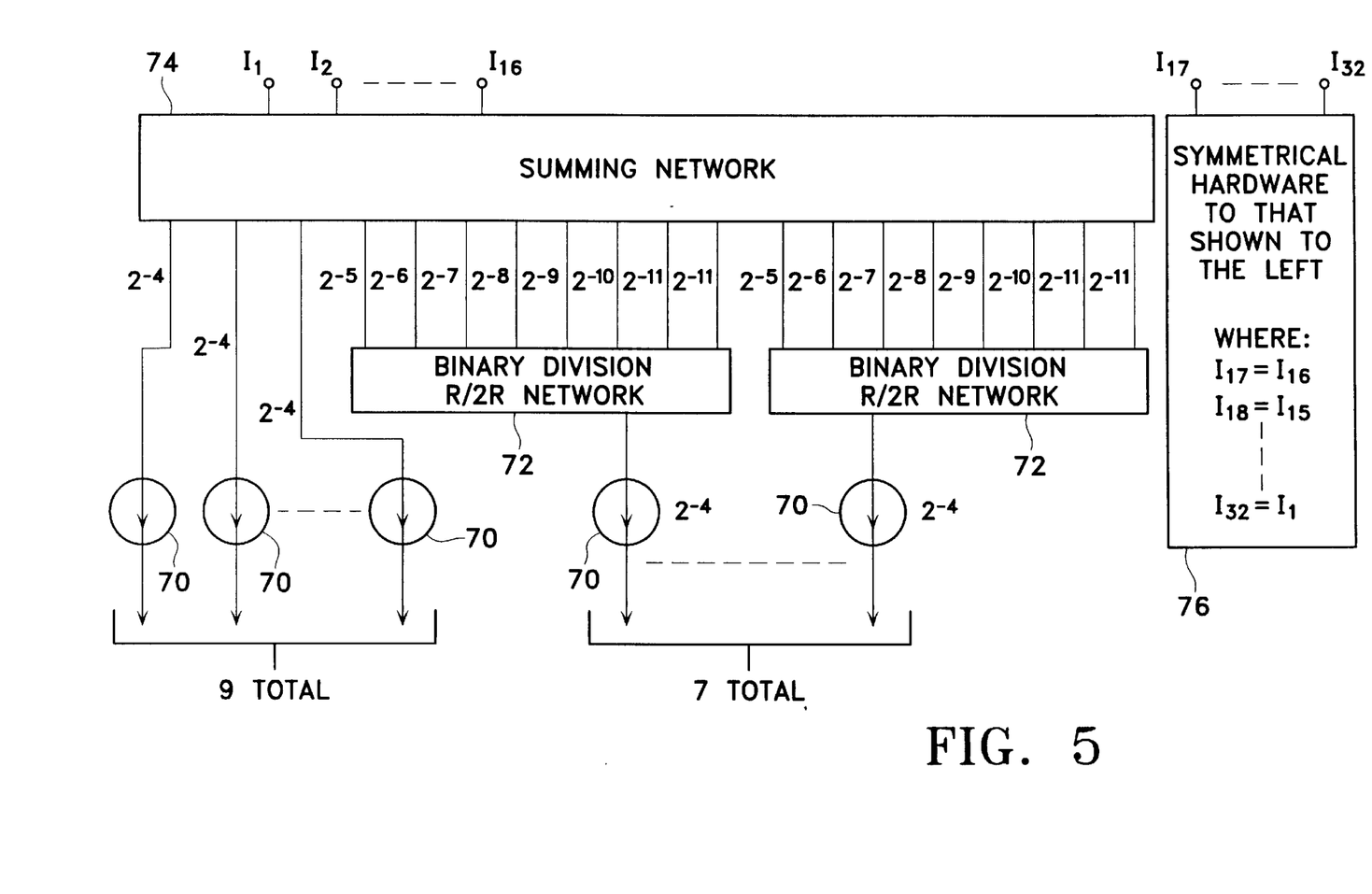
FIG. 5 is a functional schematic diagram of a set of current sources that may be used in the non-linear DAC of FIGS. 1–4.

In the illustrative embodiment of FIG. 5, sixteen identical current sources 70 are used to generate sixteen currents of selected values $I_1$–$I_{16}$ and another sixteen identical current sources (not shown) are used to generate sixteen additional currents of selected values $I_{17}$–$I_{32}$. In this embodiment, the current values are selected and scaled to provide current sources for a SINE-DAC of the type shown in FIGS. 1–4. The circuitry for providing these current sources includes the multiple identical current sources 70, a plurality of binary division networks 72 and a summing network 74. The summing network is tailored to the particular application of the current sources. For the SINE-DAC application, the summing network combines selected outputs from some of the current sources 70 and the binary division networks 72 to produce the desired current values as outputs.

More specifically, there are sixteen current sources 70 and each produces an identical current of value $(1/16)I$, where I is the total current produced by all sixteen current sources. For convenience, the various currents in the circuit of FIG. 5 will be defined as binary fractions. Thus, each of the current sources 70 generates a current of $2^{-4}$ I, which will be referred to simply by the binary fraction $2^{-4}$. In the illustrative embodiment, nine of the sources 70 are connected directly to the summing network 74. Each of the other seven sources 70 is connected to a separate binary division network 72. A binary division network, also known as an R/2R network, consists of a resistive ladder network that effects seven successive divisions of the input current by a factor of two, and provides outputs at each fractional level. This is similar to the linear interpolation network described with reference to FIG. 1. Each binary division network 72 produces output current fractions of $2^{-5}, 2^{-6}, 2^{-7}, 2^{-8}, 2^{-9}, 2^{-10}$, and $2^{-11}$. The last division by two leaves an additional remainder current of $2^{-11}$. (All these current quantities are fractions of the total current I.) The same division process is performed in each of the seven binary division networks 72 and all of the outputs are connected to the summing network 74. Thus the summing network 74 has available to it nine current fractions $2^{-4}$, seven each of the fractional current values $2^{-5}, 2^{-6}, 2^{-7}, 2^{-8}, 2^{-9}, 2^{-10}$, and fourteen of the fractional values $2^{-11}$. The summing network 74 combines these current fractions in accordance with Table 1.

TABLE 1

| | Desired current for Sine-DAC | Binary fractions combined in the summing network | Sum of binary fractions | Error |
|---|---|---|---|---|
| $I_1$ | 0.004815I | $(2^{-8} + 2^{-10})I$ | 0.0048828I | $6.78 \times 10^{-5}I$ |
| $I_2$ | 0.014399I | $(2^{-7} + 2^{-8} + 2^{-9} + 2^{-10})I$ | 0.014651I | $2.52 \times 10^{-4}I$ |
| $I_3$ | 0.023845I | $(2^{-6} + 2^{-7})I$ | 0.0234375I | $-4.075 \times 10^{-4}I$ |
| $I_4$ | 0.033061I | $(2^{-5} + 2^{-9})I$ | 0.033203I | $-1.42 \times 10^{-4}I$ |
| $I_5$ | 0.041958I | $(2^{-5} + 2^{-7} + 2^{-9} + 2^{-10})I$ | 0.0419915I | $3.35 \times 10^{-5}I$ |
| $I_6$ | 0.050452I | $(2^{-5} + 2^{-6} + 2^{-8})I$ | 0.050781I | $3.29 \times 10^{-4}I$ |
| $I_7$ | 0.058459I | $(2^{-5} + 2^{-6} + 2^{-7} + 2^{-8})I$ | 0.0585935I | $1.345 \times 10^{-4}I$ |
| $I_8$ | 0.065904I | $(2^{-4} + 2^{-9} + 2^{-10} + 2^{-11})I$ | 0.065917I | $1.3 \times 10^{-5}I$ |
| $I_9$ | 0.072713I | $(2^{-4} + 2^{-7} + 2^{-9} + 2^{-11})I$ | 0.072748I | $3.5 \times 10^{-5}I$ |
| $I_{10}$ | 0.078823I | $(2^{-4} + 2^{-6} + 2^{-11})I$ | 0.078613I | $-2.1 \times 10^{-4}I$ |
| $I_{11}$ | 0.084173I | $(2^{-4} + 2^{-6} + 2^{-8} + 2^{-9})I$ | 0.083984I | $-1.89 \times 10^{-4}I$ |
| $I_{12}$ | 0.088713I | $(2^{-4} + 2^{-6} + 2^{-7} + 5 \times 2^{-11})I$ | 0.088378I | $-3.35 \times 10^{-4}I$ |
| $I_{13}$ | 0.092399I | $(2^{-4} + 2^{-6} + 2^{-7} + 2^{-8} + 5 \times 2^{-11})I$ | 0.0922845I | $-1.145 \times 10^{-4}I$ |
| $I_{14}$ | 0.095194I | $(2^{-4} + 2^{-5} + 2^{-10} + 2^{-11})I$ | 0.095214I | $2 \times 10^{-5}I$ |

TABLE 1-continued

| Desired current for Sine-DAC | Binary fractions combined in the summing network | Sum of binary fractions | Error |
|---|---|---|---|
| $I_{15}$ | $0.097073I$ | $(2^{-4} + 2^{-5} + 2^{-9} + 2^{-10})I$ | $0.096679I$ | $-3.94 \times 10^{-4}I$ |
| $I_{16}$ | $0.098017I$ | $(2^{-4} + 2^{-5} + 2^{-8} + 2^{-10})I$ | $0.098144I$ | $1.27 \times 10^{-4}I$ |

Note that the sixteen current increments are derived from the available current sources. That is to say, the values $I_1$ through $I_{16}$ are derived from nine current fractions $2^{-4}$, seven each of the fractional current values $2^{-5}$, $2^{-6}$, $2^{-7}$, $2^{-8}$, $2^{-9}$, $2^{-10}$, and fourteen of the fractional values $2^{-11}$. The summing network 74 combines these binary weighted values in the manner shown in Table 1 to obtain a close approximation of the required incremental currents used in a SINE-DAC. The required combinations were obtained by first converting each required current increment to a fractional binary quantity, and then selecting binary weighted components from those available, to obtain an approximation of the required current increment. For example, the first required current increment $I_1$ is $0.004815I$ and this converts to an equivalent binary fraction of:

0.000 000 010 011 101 . . .

Using only eleven bits of accuracy, this fraction may be rounded to:

0.000 000 010 10.

This may be expressed as $2^{-8} + 2^{-10}$, which is the combination selected in the summing network. In designing the summing network for a particular non-linear function, some compromise of accuracy may be needed because of the necessary limitations on the available numbers of binary weighted currents.

As shown in block 76, duplicates of the current sources 70 and binary division networks 72 and a duplicate of the summing network 74 are connected in a symmetrical manner to components described above, to provide current increments $I_{17}$ through $I_{32}$, where $I_{17}=I_{16}$, $I^{18}=I_{15}$ . . . and $I_{32}=I_1$. As shown in Table 1, the maximum error for the current sources is approximately $4.1 \times 10^{-4}I$. Since the total current is $2I$, this maximum error is equivalent to an accuracy of 0.0205%, or about 11–12-bit accuracy.

It will be appreciated from the foregoing that the present invention represents a significant advance in the field of non-linear DACs. In particular, the invention provides a high-precision non-linear DAC without the need for a large number of precision current sources. The invention achieves this goal by means of piece-wise linear or non-linear interpolation and by means of a current source network that generates multiple precision current values from a limited number of identical current sources. It will also be appreciated that, although a number of specific embodiments of the invention have been described in detail for purposes of illustration, various other modifications may be made without departing from the spirit and scope of the invention. Accordingly, the invention should not be limited except as by the appended claims.

We claim:

1. A non-linear digital-to-analog converter (DAC), for producing an analog output that is a non-linear function of a digital input quantity, the DAC comprising:

a plurality (n) of non-linearly weighted current sources;

a digital input circuit for inputting a digital input quantity;

an analog output circuit;

an interpolation network; and current source selection logic, responsive to a selected number of bits of significance of the digital input quantity, for selecting one of the current sources for connection to the interpolation network and a subset of the remaining current sources for connection to the analog output circuit, wherein the current sources connected to the analog output circuit provide a combined current approximately proportional to a nonlinear function of the digital input quantity;

and wherein the interpolation network includes an input circuit into which the current source selected for connection to the interpolation network injects an input current, interpolation control logic, responsive to a selected number of bits of lesser significance of the digital input quantity, and a plurality of output taps from which various fractions of the input current are selected for combination with current from the remaining current sources, whereby a high degree of accuracy is obtained without the need for a large number of current sources.

2. A non-linear DAC as defined in claim 1, wherein the current source selection logic includes:

an equal plurality (n) of switches, each of which has an input terminal connected to a corresponding one of the current sources, an interpolate output terminal connected to the interpolation network, and at least one other output terminal connected to the analog output circuit; and switch control logic for generating control signals that select one of the switches to switch to an interpolate position in which its input terminal is connected to its interpolate output terminal, and select a subset of the remaining switches to switch to an on position in which their input terminals are connected to the other output terminals that are connected to the analog output circuit.

3. A non-linear DAC as defined in claim 2, wherein:

the analog output circuit is a differential output circuit having first and second terminals; and the plurality of switches include a first switch having an "on" output terminal connected to the first terminal of the differential output circuit, a last switch having an "off" output terminal connected to the second terminal of the differential output circuit, and remaining switches having both "on" terminals and "off" terminals.

4. A non-linear DAC as defined in claim 1, wherein:

the interpolation network effects a linear interpolation of the current values provided by the plurality of non-linear weighted current sources.

5. A non-linear DAC as defined in claim 1, wherein:

the interpolation network effects a non-linear interpolation of the current values provided by the plurality of non-linear weighted current sources.

6. A non-linear DAC as defined in claim 1, and further comprising:

at least one additional interpolation network, wherein the interpolation networks are each connected to a different subset of the plurality (n) of switches, whereby each interpolation network is effective over a different range of digital input quantities.

7. A non-linear DAC as defined in claim 6, wherein:
at least one of the interpolation networks effects a non-linear interpolation of the current values provided by a subset of the plurality of non-linear weighted sources.

8. A non-linear DAC as defined in claim 7, wherein:
at least one of the interpolation networks effects a linear interpolation of the current values provided by a subset of the plurality of non-linear weighted sources.

9. A non-linear DAC as defined in claim 1, and further comprising:
at least one additional interpolation network connected effectively in series with the first defined interpolation network;
wherein the at least one additional interpolation network is controlled by a selected set of additional bits of lesser significance of the digital input quantity, to provide an additional level of interpolation and a correspondingly greater accuracy without any additional current sources.

10. A non-linear DAC as defined in claim 1, wherein:
the plurality of non-linearly weighted current sources are derived from a limited number of identical current generators.

11. A non-linear DAC as defined in claim 1, wherein the plurality of non-linearly weighted current sources are derived from circuitry including:
a plurality of identical precision current generators;
at least one binary division network, having as an input one of the identical current generators and providing as outputs a plurality of binary weighted currents that are binary fractions of the input current; and
at least one summing network, having as inputs the binary weighted currents from the at least one binary division network and the currents from a selected number of the plurality of identical current generators, and providing as outputs the required plurality of non-linearly weighted current sources;
wherein the at least one summing network selectively combines its input currents to provide the required output currents to a high level of accuracy without the need for large numbers of precision current sources.

12. A non-linear DAC as defined in claim 11, wherein:
currents from a selected number of the identical current generators are applied directly to the at least one summing network; and
current from each of the remaining identical current generators is applied as an input to its own binary division network, which produces output currents proportional to successively smaller binary fractions of the input current.

13. A non-linear DAC as defined in claim 11, wherein:
the non-linear DAC produces a sine function output proportional to the digital input quantity;
one summing network supplies sixteen output currents used to generate differential sine function values from which are derived sine function values over an input angle range of ninety degrees;
there are sixteen identical current generators, of which nine are connected directly to the summing network and the remaining seven are connected to seven binary division networks;

each binary division network produces currents of seven successively smaller binary fractions of the input current;
the summing network combines the input currents from the identical current generators and from the binary division networks in such a manner as to produce the desired differential sine currents.

14. Apparatus for providing a plurality of output current sources of different selected values, the apparatus comprising:
a plurality of identical current generators:
at least one binary division network, having as an input one of the identical current generators and providing as outputs a plurality of binary weighted currents that are binary fractions of the input current; and
at least one summing network, having as inputs the binary weighted currents from the at least one binary division network and the currents from a selected number of the plurality of identical current generators, and providing as outputs the required plurality of output current sources;
wherein the at least one summing network selectively combines its input currents to provide the required output currents to a high level of accuracy without the need for large numbers of precision current sources.

15. Apparatus as defined in claim 14, wherein:
currents from a selected number of the identical current generators are applied directly to the at least one summing network; and
current from each of the remaining identical current generators is applied as an input to its own binary division network, which produces output currents proportional to successively smaller binary fractions of the input current.

16. Apparatus as defined in claim 15, wherein:
the current output sources of different selected values are differential sine values for use in a SINE-DAC;
one summing network supplies sixteen output currents;
there are sixteen identical current generators, of which nine are connected directly to the summing network and the remaining seven are connected to seven binary division networks;
each binary division network produces currents of seven successively smaller binary fractions of the input current; and
the summing network combines the input currents from the identical current generators and from the binary division networks in such a manner as to produce the desired differential sine currents.

17. Apparatus as defined in claim 16, wherein:
each of the identical current generators provides a current proportional to one-sixteenth, or $2^{-4}$, of total current generated by all sixteen of the identical current generators:
each binary division network generates output currents proportional to seven successively smaller binary fractions of the input current, from $2^{-5}$ through $2^{-11}$, together with a remainder current of $2^{-11}$; and
the summing network combines the input currents in such a way as to produce sixteen differential sine output currents, which, when combined by addition of successive ones of the output currents, provide currents that are proportional to a sine function.

18. A method for generating a set of currents of selected values, the method comprising the steps of:

generating a plurality of currents of identical value;

applying some of the plurality of currents to binary division networks;

generating in each binary division network a set of output currents that are successively smaller binary fractions of the input identical current; and combining in a summing network a selected number of the currents of identical value with the output currents from the binary division networks, wherein precision outputs of selected values are provided without the need for large numbers of precision current sources.

19. A method as defined in claim 18, wherein:

the summing network is configured to use all of the binary division network outputs and all of the remaining identical currents, to provide the desired output currents with a minimum number of current sources.

20. A method of operation of a non-linear digital-to-analog converter (DAC), comprising the steps of:

(a) generating a plurality of weighted currents;

(b) receiving a digital input quantity;

(c) based on a selected number of bits of the digital input quantity, selecting a set of the weighted currents to be combined to provide an output current that is approximately proportional to a desired non-linear function of the digital input quantity;

(d) based on the value of the digital input quantity, selecting one of the weighted currents to be interpolated for greater accuracy of output;

(e) connecting the weighted current to be interpolated to an interpolation network;

(f) controlling the interpolation network based on a selected number of bits of the digital input quantity, to provide an interpolation current; and (g) combining the set of weighted currents selected in step (c) and the interpolation current provided in step (f), to generate an output current proportional to the desired non-linear function of the digital input quantity.

21. A method as defined in claim 20, wherein:

the interpolation current provided by the interpolation network is a result of linear interpolation between current values.

22. A method as defined in claim 20, wherein:

the interpolation current provided by the interpolation network is a result of non-linear interpolation between current values.

23. A method as defined in claim 20, wherein:

the step (e) of connecting to an interpolation network includes connecting to one of at least two interpolation networks covering non-overlapping groups of the weighted currents.

24. A method as defined in claim 23, wherein:

each of the interpolation networks provides an interpolation current that is a result of linear interpolation between current values.

25. A method as defined in claim 23, wherein:

each of the interpolation networks provides an interpolation current that is a result of non-linear interpolation between current values.

26. A method as defined in claim 21, and further comprising the steps of:

applying the interpolation current provided in step (f) to an additional interpolation network;

controlling the additional interpolation network based on the value of an additional set of bits of lesser significance in the digital input quantity, to provide an additional interpolation current; and combining the additional interpolation current with the output current to provide additional accuracy without any additional current sources.

27. A method as defined in claim 20, wherein the step of generating a plurality of weighted currents includes:

generating a plurality of currents of identical value;

applying some of the plurality of currents to binary division networks;

generating in each binary division network a set of output currents that are successively smaller binary fractions of the input identical current; and combining in a summing network a selected number of the currents of identical value with the output currents from the binary division networks, wherein precision outputs of selected values are provided without the need for large numbers of precision current sources.

28. A method as defined in claim 27, wherein:

the summing network is configured to use all of the binary division network outputs and all of the remaining identical currents, to provide the desired output currents with a minimum number of current sources.

29. A method as defined in claim 20, wherein:

the step (a) of generating a plurality of weighted currents generates differential sine function currents, which, when added together cumulatively, produce a sine function output signal proportional to the sine of an angle represented by the digital input quantity.

* * * * *